United States Patent [19]

London et al.

[11] Patent Number: 5,372,482
[45] Date of Patent: Dec. 13, 1994

[54] DETECTION OF ROD PUMP FILLAGE FROM MOTOR POWER

[75] Inventors: Robert K. London, Bakersfield, Calif.; David G. Loucks, Sugar Land, Tex.

[73] Assignee: Eaton Corporation, Cleveland, Ohio

[21] Appl. No.: 35,471

[22] Filed: Mar. 23, 1993

[51] Int. Cl.$^5$ .............................................. F04B 49/00
[52] U.S. Cl. ....................................... 417/12; 417/18; 417/44.11; 417/53; 417/63
[58] Field of Search .................... 417/12, 44 J, 18, 53, 417/63

[56] References Cited

U.S. PATENT DOCUMENTS

| | | |
|---|---|---|
| 4,220,440 | 9/1980 | Taylor et al. . |
| 4,420,787 | 12/1983 | Tibbits et al. ...................... 417/44 J |
| 4,493,613 | 1/1985 | Sommer . |
| 4,601,640 | 7/1986 | Sommer . |
| 4,695,779 | 9/1987 | Yates . |
| 4,767,280 | 8/1988 | Markuson et al. .................. 417/44 J |
| 4,841,404 | 6/1989 | Marshall et al. ................... 417/44 J |
| 5,070,725 | 12/1991 | Cox et al. . |
| 5,284,422 | 2/1994 | Turner et al. ......................... 417/18 |

*Primary Examiner*—Richard A. Bertsch
*Assistant Examiner*—David W. Scheuermann
*Attorney, Agent, or Firm*—Martin J. Moran

[57] ABSTRACT

The extent to which a reciprocating pump for an oil well fills between successive pump strokes is determined indirectly from variations in the power consumption of an electric motor driving the pump. The power consumption is sampled numerically and a processor determines the phase of data in the samples from phase references defined by a peak and/or zero crossing in the cyclic operation of the pump and motor. When the pump fills incompletely between strokes, for example when the pump is operated at too high a frequency, the well rod moves against decreased resistance during the downstroke. The processor determines the point in the pump cycle at which the well rod encounters fluid from the increased power consumption, obtaining an indirect indication of fillage. The instantaneous power consumption preferably is measured by a module associated with an electrical contactor or motor starter included in an improved pump controller or "pump panel" that includes a programmable controller effecting the processor functions and also functioning as an off-pump control for regulating activation of the pump.

17 Claims, 3 Drawing Sheets

DETECTION OF ROD PUMP FILLAGE FROM MOTOR POWER

BACKGROUND OF THE INVENTION

1. Field of the Invention

The invention relates to controls and monitors for oil well rod pumps and similar cyclic loads. In particular, the rate at which the underground pump chamber refills in the interval between power strokes of a rod pump is determined indirectly by monitoring variations in electrical loading of the pump motor at particular phase regions in the cycle of the pump. The phase position of the pump cycle is referenced by power peaks or zero crossings of the cyclic load. A controller having a digital processor samples the electrical loading during the pump cycle. Variations in the extent of pump chamber refilling preferably are determined by examining the cycle by cycle differences in the power level of the pump during the downstroke, when the pump rod travels freely through air until encountering fluid.

2. Prior Art

Oil well walking beam pumps extract fluid from a downhole pump chamber by repeatedly raising and lowering a series of steel rods coupling the downhole pump and the surface beam pumper assembly. The repetitive raising and lowering of the steel rods causes a piston in the downhole pump assembly to pull the well fluids to the surface.

The surface beam pumper assembly typically includes a rocking beam with one end coupled to a pump motor by a crank assembly. The crank assembly has a counterweight intended to balance the loading of the motor by offsetting at least part of the weight of the pump connecting rods which are cantilevered on the opposite end of the rocking beam. Nevertheless, as the rods to the downhole pump are raised and lowered, the loading of the motor passes through a cycle during which potential energy is stored as the pump rods are lifted, and released as the pump rods are lowered.

The motor is typically an electric motor that is geared down to accommodate the relatively low frequency of the pump stroke. A three phase motor is typical. Motor and circuit protection contactor devices typically are provided for breaking the motor circuit in the event of a short circuit or motor overload. Additionally, a controller that is responsive to conditions in the well may be coupled to the contactor devices, for example to operate the pump intermittently at a rate that can be supported by the geological formation. The controller or the contactor device itself may include means for measuring the current in the motor circuit and/or the line voltage by analog or digital circuits, as a part of the circuit protection function, as well as to vary the operation of the pump to suit conditions at the best efficiency.

It is known to provide a contactor for an oil well with relay contacts that rearrange the line couplings of a three phase motor when current loading conditions indicate that the pump is operating inefficiently, for example as disclosed in U.S. Pat. No. 4,220,440—Taylor et al. U.S. Pat. No. 4,695,779—Yates discloses a similar controller that includes a processor and a number of timers that switch between operational modes upon the occurrence of distinct stall conditions.

A processor with a range of flow and energy consumption sensors for assessing well operation is disclosed in U.S. Pat. No. 4,767,280—Markuson, and a processor that integrates additional factors such as the proportions of oil and water in the recovered fluid is disclosed in U.S. Pat. No. 5,070,725—Cox et al.

Although the invention is described herein primarily with reference to a walking beam pump, it is also possible to apply the concepts of a walking beam pump to other forms of cyclic loads. U.S. Pat. Nos. 4,601,640 and 4,493,613, both to Sommer, for example, disclose a compact pump arrangement that reciprocates a piston but does not employ a beam. Instead, a reversing motor manipulates the piston via a cable. These, and the foregoing U.S. Patent disclosures are hereby incorporated by reference, for their teachings of well motor control and sensing arrangements.

Wells are frequently instrumented for purposes of assessing operational parameters. The fluid flow rate produced by the well is an advantageous parameter to measure, and can be measured using flow rate sensors at any point along the conduits through which the fluid is pumped. The fluid pressures produced in the well by the pump can also be monitored, and used to develop additional information, such as the rate at which the geological formation is refilling the pump, and other aspects of well performance. One means for sensing well fluid pressure indirectly is to sense tension and compression of the moving pump structures, for example using strain gauges mounted on such structures or load cells coupled between them.

There are a number of aspects of well and/or pump performance that are pertinent to issues of efficiency, maintenance, capacity, switching between operational modes and the like. The object for the well is of course to supply the maximum fluid possible, and preferably to maximize the percentage of the fluid that is oil rather than water or mud while minimizing the power consumption of the pump. However, optimizing pump operation requires that the operation of the pump be varied to suit conditions. A monitoring system and controller can be provided to sense conditions and to adjust operational parameters such as the frequency of cyclic operation, the manner in which power is coupled to the motor windings and so forth.

The amount of useful work that a fluid transport device performs is the product of the mass rate of fluid flow and the pressure differential or elevation head. The total head borne by the pump includes static and dynamic factors such as the discharge head and the suction head maintained, a velocity head, frictional resistance, etc. The variations in a number of these factors, especially fluid pressure and fluid flow, is cyclic due to the cyclic operation of the pump. It is therefore necessary to assess fluid pressure and flow information as a function of the point at which such data is sampled in the periodic cycle of the pump. The monitoring and control system of the pump thus requires the input of information on the present phase angle of the pump.

The phase angle of the pump can be measured by more or less sophisticated means. For example, a limit switch can be mounted for repetitive operation by contact with the pump beam, and used to trigger sampling of process data at the same point during every cycle, or between counted cycles. A shaft angle encoder can be mounted to produce pulses with angular displacement of the beam or of the motor crank, etc., which allows measurements to be taken at defined points in the cycle. These devices require proper setup and maintenance, and can suffer from mechanical failure. Thus the known arrangements are expensive both initially and with continuing maintenance and use.

It is possible in the operation of a rod pump or the like to run the pump at a frequency that exceeds the rate at which the geological formation can refill the pump chamber. Should the pump be operated at too high a rate, part of the electrical energy expending in reciprocating the pump is wasted because each stroke lifts only a portion of the full stroke capacity of the pump. Inefficient operation of the pump in this manner is characterized by a greater expenditure of energy in friction, per unit of fluid pumped, than would occur if the pump chamber was refilled between strokes and each stroke lifted a full stroke capacity volume of fluid.

When the pump rod begins a down stroke, the pump motor must raise the counterweights using electrical power if the well is full. If the well is pumped off (not yet refilled), the pump rod travels through air on the down stroke until the fluid level is reached. Gravity and the combined weight of the pump rod and the fluid carried in the pump rod assist in raising the counterweights during this free fall of the pump rod. When the surface of the fluid is reached by the pump rod, the motor power is greater. It is possible to mount strain gages or load cells as well as rod position sensors, to determine when the pump is not refilling at the same rate the fluid is being pumped out. However, such measurements are complex and the sensors and connections are subject to mechanical stress.

It would be advantageous to provide a device that can determine information needed for assessing or controlling this aspect of pump operation without such components. The present invention is arranged to develop information on the filling rate of a rod pump indirectly from variation in the loading of the pump motor. It has been discovered that the electric power consumption of the pump motor in the free-fall condition characteristic of incomplete pump filling is reduced to about one half of the power consumption in the normal condition when the pump is full. By collecting and examining sampled data representing electrical power consumption, as referenced to a phase angle determined during each pump cycle from the point of minimum instantaneous power consumption, the invention detects the fillage of the pump. The fillage data can be reported or used to signal a pump-off controller to reduce the rate of operation of the pump or to assume an inactive state to permit the geological formation time to recover.

SUMMARY OF THE INVENTION

It is an object of the invention to assess operational parameters of a cyclic load such as a well pump from the electrical loading of a motor operating the pump.

It is also an object of the invention to determine the fillage of a pump by examining the instantaneous power to a pump motor at particular phase positions in successive cycles of pump operation.

It is a further object of the invention to provide a pump controller that develops information for assessing the operation of a well and well pump with minimal reliance on sensors, using instead the variations in power consumption of the pump motor, as detected by the pump controller.

It is another object of the invention to integrate the solution to the foregoing objects into a modular power protection device as an accessory to a contactor or circuit breaker having available a means for monitoring the power consumption of a load coupled thereto, and preferably to sense both the level of power coupled between a pump motor and a power grid as well as the polarity of such power.

These and other objects are accomplished according to the invention using a pump controller coupling the electric motor of a cyclically operating well pump to a power line. The extent to which a reciprocating pump for an oil well fills between successive pump strokes is determined indirectly from variations in the power consumption of an electric motor driving the pump. The power consumption is sampled numerically and a processor determines the phase of data in the samples from phase references defined by a peak and/or zero crossing in the cyclic operation of the pump and motor. When the pump fills incompletely between strokes, for example when the pump is operated at too high a frequency, the well rod moves against decreased resistance during the downstroke. The processor determines the point in the pump cycle at which the well rod encounters fluid from the increased power consumption, obtaining an indirect indication of fillage. The instantaneous power consumption preferably is measured by a watt transducer module such as the Westinghouse Electric Energy Sentinel TM watt transducer, associated with an electrical contactor or circuit breaker such as the Westinghouse Advantage TM three phase contactor. The device is included in an improved pump controller or "pump panel" that includes a programmable controller effecting the processor functions and also functioning as an off-pump control for regulating activation of the pump. The signals developed according to the invention also can be multiplexed to a centralized controller responsive to a number of pumps, for example using multiplexing or remote data reporting means.

BRIEF DESCRIPTION OF THE DRAWINGS

There are shown in the drawings certain exemplary embodiments of the invention as presently preferred. It should be understood that the invention is not limited to the embodiments disclosed as examples, and is capable of variation within the scope of the appended claims. In the drawings.

DETAILED DESCRIPTION OF THE PREFERRED EMBODIMENTS

Figure 1:
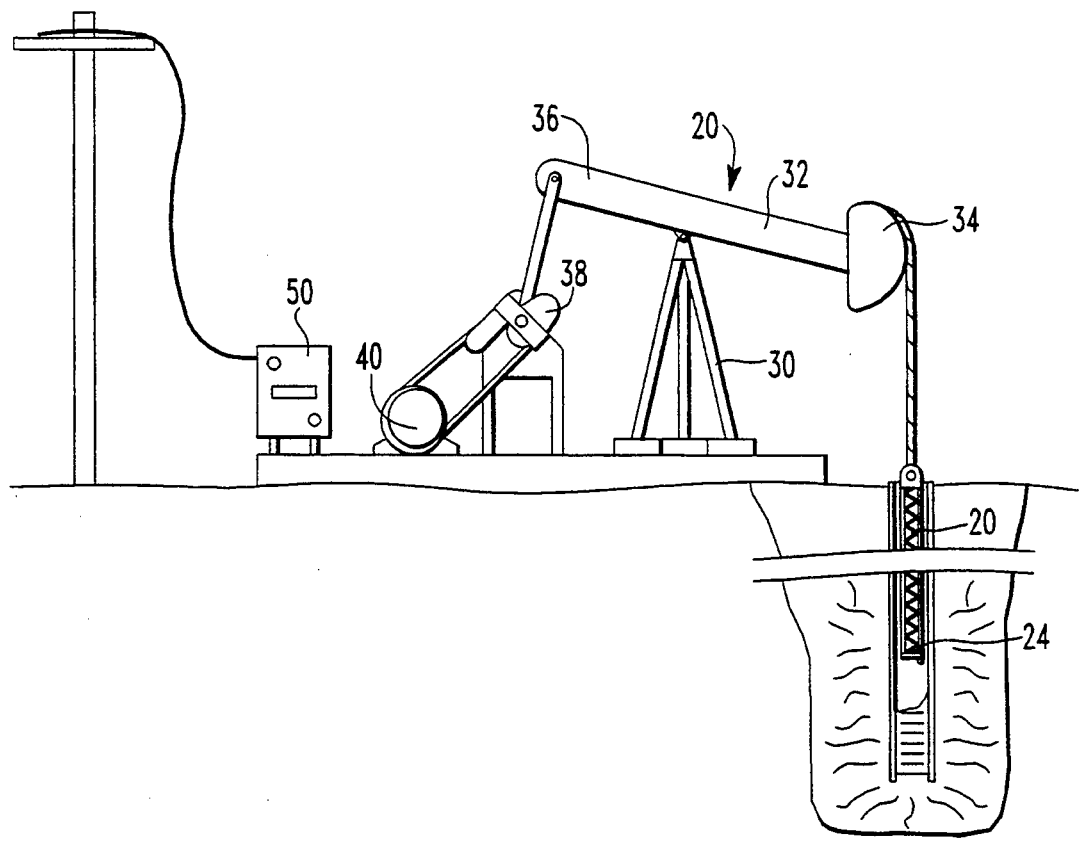
FIG. 1 is an elevation view showing a cyclically operated pump arrangement according to the invention.

As shown in FIG. 1, a well pump arrangement 20 according to the invention has a series of connecting rods 22 coupling a downhole piston/chamber pump 24 to a surface walking beam pumper 30. The surface pumper 30 has a rocking beam 32 with one end 34 connected to the downhole rods 22 and an opposite end 36 connected by eccentric linkages to a rotating counterweight member 38. The counterweight member 38 is rotated by an electric motor 40, being coupled by a belt or chain drive, and/or coupled to the motor 40 through a gear train. As the motor 40 turns the counterweight member 38, the beam 32 is rocked to raise and lower the downhole rods 22, operating the pump 24 in a periodic manner at a relatively low frequency.

The motor 40 can be a three phase multi-winding AC motor, for example operable at 440 VAC, and developing 10 to 125 horsepower, depending on the capacity and depth of the pump 24. As shown schematically in FIG. 2, the pump arrangement 20 can be provided with a contactor 44 operable to activate and deactivate pumping, to change the winding configuration between Y, ΔY and Δ, as disclosed in U.S. Pat. Nos. 4,220,440—Taylor and 4,695,779—Yates, and/or can be coupled to an overload/underload controller including a processor and timing means as in U.S. Pat. No. 4,767,280—Markuson et al, each of which patents is incorporated herein by reference.

According to the invention, a controller 50 of this general type is arranged to calculate the values of process variables from the electric power applied to the pump motor 40. As a result, well and pump performance monitoring data is obtained and decisions can be made for controlling operation of the pump 20, with no or minimal reliance on sensors for detecting tension, compression, flow rate, pressure and other similar variables that might otherwise be used to assess the pumping operation.

Figure 2:
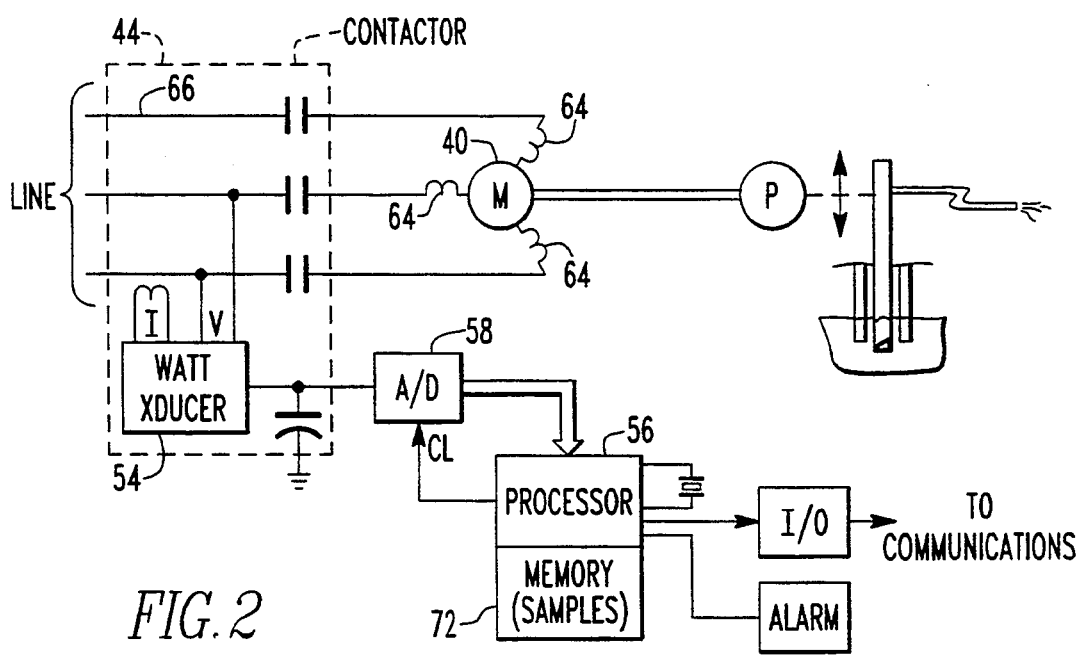
FIG. 2 is a schematic block diagram showing the functional elements of the invention.

Referring to FIG. 2, the controller 50 is coupled to a transducer 54 operable to sense the instantaneous electric power level drawn from the power line 66 by the electric motor 40 operating the well pump 24. In the embodiment shown, the controller 50 comprises a digital processor 56 and the transducer 54 comprises a watt transducer that produces a voltage output proportional to the instantaneous power level. The watt transducer can be a Westinghouse Energy Sentinel transducer, coupled as a modular part of an Advantage circuit breaker, and develops an output representing the amplitude of the power coupled between the pump motor and the power grid, as well as the polarity, which typically reversed during a regenerative stage of the pump cycle at top dead center, when the momentum of the pump regenerates power to the grid. Accordingly, power or current "consumption," as used herein, should be construed to include regeneration or negative power consumption. A peak or zero crossing occurring during every cycle, such as the minimum point of power consumption, is used to define a reference point or phase in the cyclic power variation of the pump, whereby variations in the power over time can be examined with reference to their phase angle in the cycle of the pump.

The voltage output of the watt transducer is sampled using an analog to digital converter 58 clocked periodically by the controller 50, at a frequency substantially higher than the frequency of cyclic pump operation, e.g., several times per second. The watt transducer 54 averages the AC power consumption of the motor 40 over the power line frequency, but produces a substantially sinusoidal output signal at the frequency of the pump 24. This occurs because as the pump 24 raises and lowers the downhole pump rods 22 during each pump cycle, the motor 40 is cyclically loaded. The pump arrangement 20 passes through a power stroke, and then with continuing momentum passes through a regenerative stroke, each cycle including the power and regenerative portions.

Motor loading is at its minimum during the times that the beam 32 is at the top and bottom of its stroke. An absolute minimum occurs immediately preceding the downstroke portion of the cycle. The power at this point reverses and becomes negative as the momentum of the pump 24 and connecting rod structures 22 cause regeneration of the motor 40.

The watt transducer 54 effectively measures the RMS current in the motor windings 64 and the RMS voltage across the power line 66, and multiplies these values to produce the output presented to the analog to digital converter 58 representing the instantaneous power level. It is also possible to approximate the instantaneous power level by measuring only for current, thus assuming that the voltage level remains at the nominal voltage of the power grid. However, to obtain information respecting the regenerative portion of the cycle, it is necessary not only to measure current amplitude but also to determine the polarity of the power coupled between the power grid and the motor, i.e., whether the grid is supplying power to the motor or vice versa. The Westinghouse Energy Sentinel is responsive to both current and voltage, and is responsive to the polarity of the power. Reliance on a measurement of current alone provides an approximation, but is less accurate than taking current and voltage into account, due to the reactive nature of the electrical load, particularly as the motor 40 is cyclically loaded and regenerated.

Preferably, the invention is embodied as an improved form of pump controller of the type known as a "pump panel" in the industry, but is provided with additional computational capabilities in order to effect the objects of the invention. The smart pump panel of the invention can be based on an electromechanical contactor—motor starter or circuit breaker arrangement such as the Advantage TM three phase contactor marketed by Westinghouse Electric Corporation, preferably including the Energy Sentinel TM module that is mounted on the starter and includes current and voltage sensing circuits, a filter and multiplying arrangement, and an analog to digital converter for producing a digital output representing the instantaneous energy coupled between the power line and the load coupled thereto, such as motor 40. The digital data is coupled to a programmable controller forming the processor 56 of the controller 50, and is read, for example, every 150 to 200 mS to collect instantaneous power consumption data. The programmable controller is coupled to input/output modules whereby the sample data and the data generated by computation from the sample data and/or from additional sensor inputs can be communicated to recording or communication devices. Preferably, the output data developed by the controller 50 is communicated by radio modem, line drivers, telephone modem or the like to a remote location. However it is also possible to use the data only locally, in connection with a pump-off type controller (for determining when and for how long the pump should run) that has the additional capabilities discussed herein.

It is also possible to arrange for shared communications between the watt transducers of a plurality of pump motors and a single controller, for example using time or frequency division multiplexing. Similarly, the data developed by a plurality of controllers, each serving a single pump or a group of pumps, can be communicated to a more centralized control or data logging control means.

Figure 3:
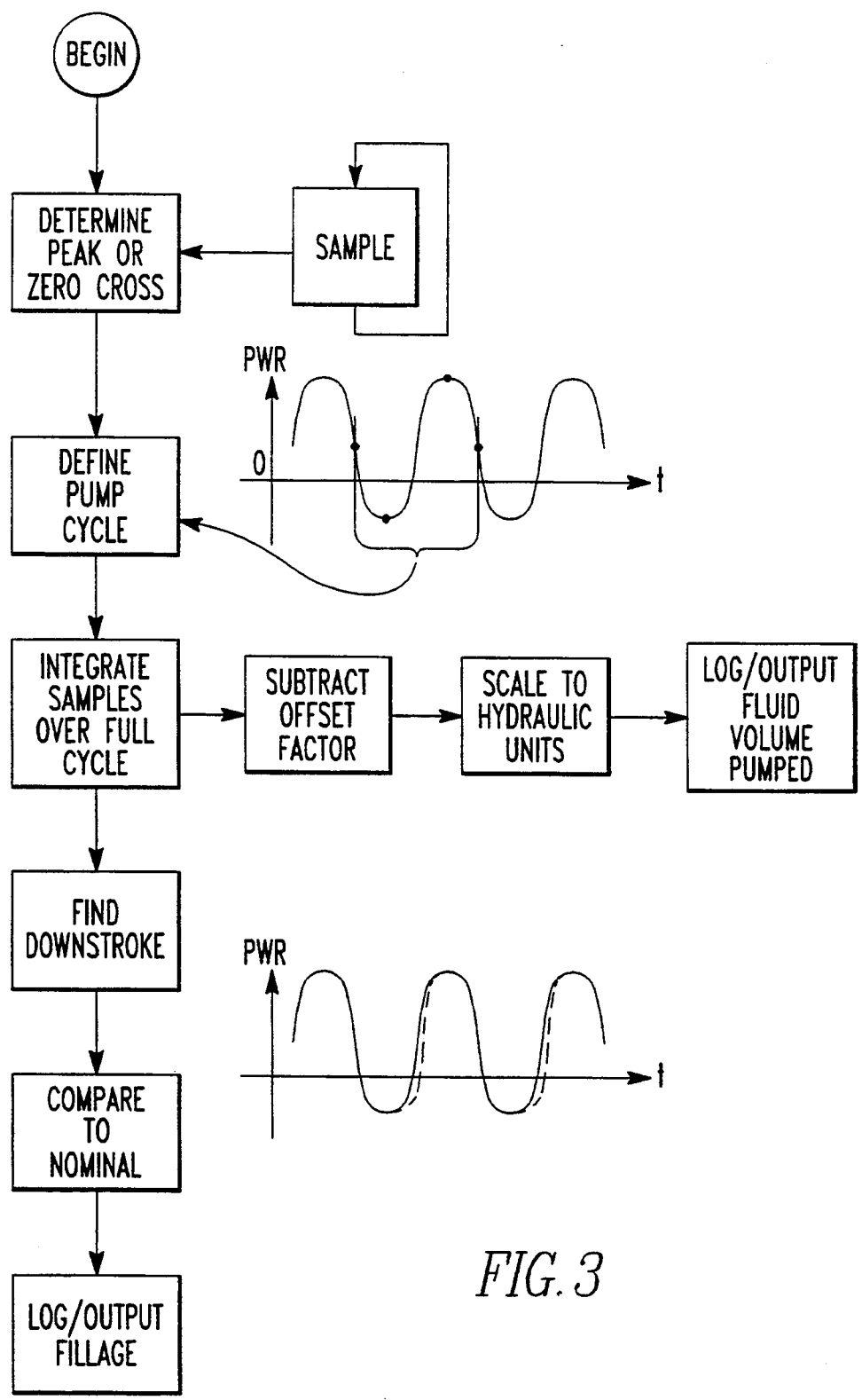
FIG. 3 is a flowchart illustrating the measurement and processing steps according to the invention.

As shown by the flowchart diagram of FIG. 3, the processor 56 of the controller 50 stores the data representing the sampled power level and processes the data to determine the times at which successive minimums occur. These minimums define the operational pumping frequency. The controller 50 then integrates the detected instantaneous power level by adding the sampled data values over a complete pump cycle. The result is a value proportional to hydraulic power exerted, plus a value representing the frictional losses of the pump arrangement 20 and motor 40 as a whole.

The integrated power level over the pump cycle is stored or logged, to enable analysis and comparison of the power levels over a number of cycles. The controller 50 can be arranged to store the data in a local memory 72 and/or to record the data for longer term storage on a tape or disk, to print reports or graphic plots, or to report the data via remote communication, e.g., over a modem.

The hydraulic power exerted and the frictional loss both vary over time and for successive pump cycles. However, frictional losses tend to vary very slowly in comparison to the variation of the hydraulic power or useful work exerted by the pump 24. The power variances over a relatively short period (e.g., less than one day) are primarily due to changes in hydraulic power. According to the invention these power variances are correlated to the useful work accomplished by the pump, i.e., to the volume of fluid extracted from the well.

The variations in hydraulic horsepower (i.e., the changes over periods longer than the pump cycle frequency) can be analyzed and used in a number of ways. In addition to reporting the approximate volume of fluid pumped, the variations can be used to make operational and maintenance decisions. Contactor 44, operated by outputs from the controller 50 can activate and deactivate the pump 24, change the configuration of pump motor windings 64, operate alarms or signals for maintenance, and otherwise manage the pump arrangement 20 for efficient operation, relying substantially on the information available to the controller 50 by monitoring the electric power consumption of the pump motor 40.

According to the invention, the controller is operable to assess the extent to which the pump refills with fluid between strokes of the pump. It is possible in the operation of a rod pump or the like to run the pump at a pumping frequency greater than the rate at which the geological formation refills the pump chamber, which is inefficient. Should the pump be operated at too high a rate, part of the electrical energy expending in reciprocating the pump is wasted because each stroke lifts only a portion of the full stroke capacity of the pump.

When the pump rod begins a down stroke, the pump motor must raise the counterweights using electrical power if the well is full. If the well is pumped off (not yet refilled), the pump rod travels through air on the down stroke until the fluid level is reached. Gravity and the combined weight of the pump rod and the fluid carried in the pump rod assist in raising the counterweights during this free fall of the pump rod. When the surface of the fluid is reached by the pump rod, the motor power is greater.

According to the invention, the sampled power consumption levels are analyzed by the controller to distinguish between full pump and empty pump conditions, and preferably to determine the extent of pump fillage between these extremes. The power consumption in a free-fall condition of the pump rods is about one half of the power consumption in the normal condition when the pump is full. By collecting and examining sampled data representing electrical power consumption, as referenced to a phase angle determined during each pump cycle from the point of minimum instantaneous power consumption, the invention detects the fillage of the pump.

As shown in the flowchart of FIG. 3, successive pump cycles are defined by searching for repetitive peaks or zero crossings in the power level sampled from the watt transducer. This data can be used to effect various additional computations such as assessing the total volume pumped or the frictional load on the pump. According to the invention, the downstroke portion of the pump cycle is located in the samples by interpolating between the peaks or zero crossings. Incomplete pump filling produces a variation in the pump power in this phase area, as shown by broken lines in the lower graph of power vs. time in FIG. 3. The controller is arranged to assess the extent to which the pump has not recovered, specifically to determine the phase position at which the power level rises from a reduced level (due to free-fall of the pump) to nominal (when the pump encounters fluid). The timing of the return to nominal power level is then related to the proportional fillage of the pump between strokes. The fillage data can be reported or used to signal a pump-off controller to reduce the rate of operation of the pump or to assume an inactive state to permit the geological formation time to recover.

Figure 4:
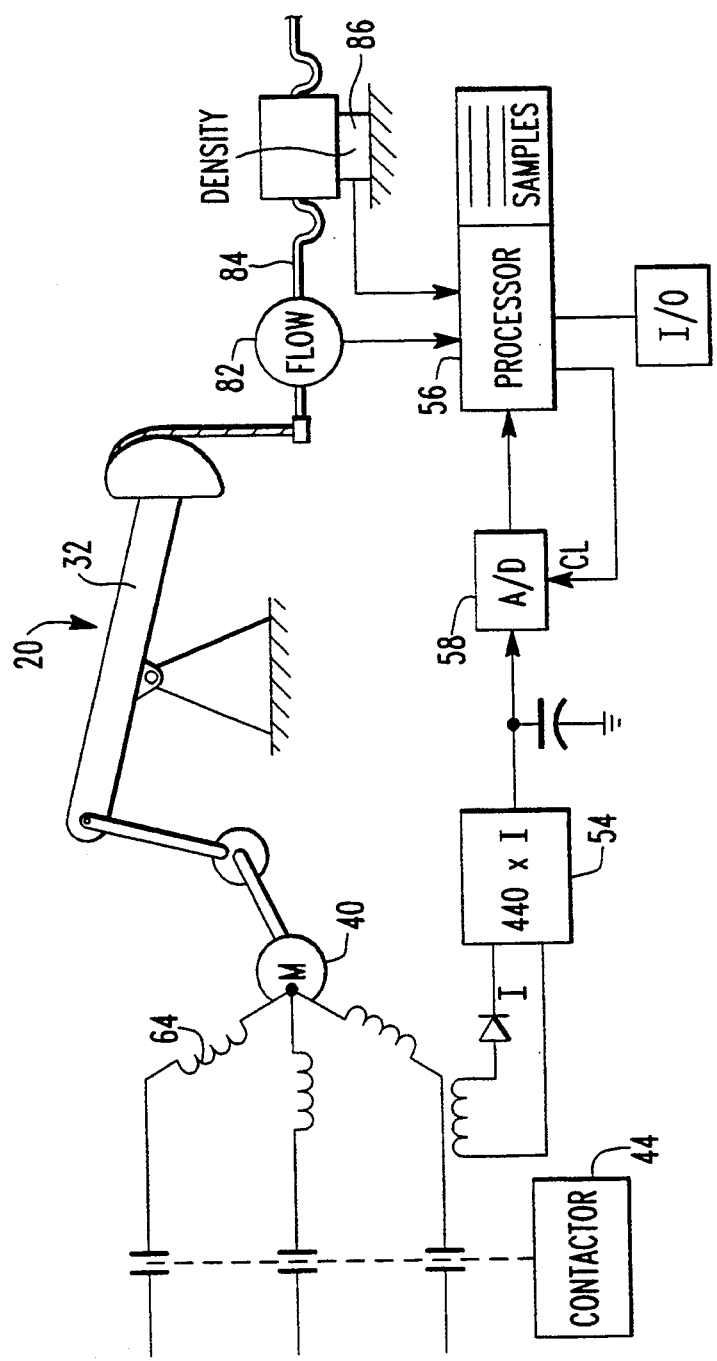
FIG. 4 is a schematic block diagram showing an alternative arrangement wherein the instantaneous power consumption is determined from the RMS current level.

FIG. 4 illustrates an alternative embodiment wherein the power level is sensed from the instantaneous current level, providing an approximation of the power consumption. This approximation should include the polarity of power coupling between the line and the load, as discussed above. Additionally, the embodiment shown is provided with sensors 82, 86 for more accurately processing the sampled power level for distinguishing the useful work exerted by the pump 24 from frictional losses and other overhead. At least one flow sensor 82 is mounted along an output conduit 84 of the pump 24 and is coupled to the processor 56 for collecting flow data by direct measurement. The flow sensor 82 is operable at least intermittently to measure fluid flow for calibrating the calculations undertaken by the processor 56. Instantaneous flow data is also integrated over a pump cycle. The actual fluid flow during a cycle, or preferably the actual fluid flow averaged over a number of cycles, is scaled for conversion from units of hydraulic work (e.g., the product of the fluid head elevation lifted, times the integrated flow volume and average weight, is converted to units of electric power, e.g., watt-hours) and is subtracted from the measured total electrical load to determine the proportion of the power lost to friction. The friction losses can be monitored over time to determine when pump maintenance is required. The offset factor applied to the integrated electric power data can be updated, whereby it is not necessary to operate the flow sensor constantly.

As also shown in FIG. 4, a density sensor 86 is also preferably mounted along an output conduit 84 of the pump 24 and is coupled to the controller processor 56 to provide a further improvement in accuracy. The density sensor 86 is operable to measure the density of the pumped fluid, which typically includes oil, water and mud. The proportions of water and mud affect the work required to lift the fluid. The processor 56 preferably is operable to factor the density into account in calculating a fluid output volume of the pump 24 as a function of the integrated work data and the density, this data also being logged and reported. The flow and density sensors can produce analog or digital outputs in known manner. Analog values are coupled to the processor 56 through an analog to digital converter. Digital numeric values can be coupled to processor inputs. Pulsed digital signals can be coupled to the processor 56 via a counter or used to trigger a processor interrupt.

The flow and density data are useful for removing the confounding factors of variation in friction and in the character of the fluid pumped. Accordingly, the cyclic power level data is more accurately related to the practical operation of the pump in lifting fluid, and according to the invention determining the extent to which the pump refills between strokes. Such data are also useful for adjusting estimates of the fluid output and frictional loss by permitting recalibration of scaling and offset factors used to convert electrical power data to units of hydraulic work.

The invention having been disclosed in connection with the foregoing variations and examples, additional variations will now be apparent to persons skilled in the art. The invention is not intended to be limited to the variations specifically mentioned, and accordingly reference should be made to the appended claims rather than the foregoing discussion of preferred examples, to assess the scope of the invention in which exclusive rights are claimed.

We claim:

1. A pump controller for a well pump having pumping means operated cyclically under power of an electric motor coupled to a power line, the well having a maximum capacity per pump stroke, the pump controller comprising:
   means for measuring an instantaneous level of current supplied to the motor from the power line and an instantaneous level of voltage across the power line, said means for measuring producing an output as a function of a product of the instantaneous current and voltage representing instantaneous electrical power consumption of the motor;
   means for determining a time of passage of the well pump through a reference point in periodic cycles of the well pump; and,
   a processor operable to compare the output of said means for measuring, for successive periodic cycles, at least at one predetermined phase region relative to the reference point, for identifying variation in power consumption of the well pump characteristic of operation at less than the maximum capacity per pump stroke.

2. The pump controller according to claim 1, wherein said at least one predetermined phase region includes a downstroke of the pump, and the processor is operable to detect a reduction in power consumption during the downstroke characteristic of fall of a portion of the pump to a fluid level in a pump chamber of the pump.

3. The pump controller according to claim 1, further comprising an electrical contactor coupling the motor to the power line, and wherein said means for measuring comprises a watt transducer of the electrical contactor.

4. The pump controller according to claim 1, wherein the passage of the pump through the reference point is determined by the processor by one of a relative peak and a zero crossing in the instantaneous electrical power consumption.

5. The pump controller according to claim 4, wherein the reference point is a point of minimum power consumption occurring between a power stroke in said cycles and regeneration by the motor due to momentum of the pump.

6. The pump controller according to claim 1, wherein the processor is operable to integrate the power consumption during the downstroke of each successive cycle of the pump, and to compare a total power consumption during the downstroke to a predetermined minimum value, the processor including means to output a signal when the total power consumption during the downstroke fails to exceed the predetermined minimum value.

7. The pump controller according to claim 6, wherein the predetermined minimum value is approximately half a nominal power consumption value characteristic of operation at the maximum capacity per pump stroke.

8. An oil well arrangement, comprising:
   a well pump having an electric motor operable to reciprocate a piston and chamber structure disposed in a well bore;
   a pump controller coupled between the well pump and an electric power line, the controller including a watt transducer coupled to an analog to digital converter, for measuring an instantaneous power consumption of the motor from the power line, a processor being coupled to an output of the analog to digital converter, and operable to identify periodic cycles of the pump from periodic variations in said instantaneous power consumption, the processor comparing the instantaneous power consumption for successive periodic cycles, at least at one predetermined phase region of the periodic cycles, for identifying variation in power consumption of the well pump characteristic of operation at less than a maximum capacity of the pump per stroke.

9. The oil well arrangement according to claim 8, wherein the processor is operable to determine said at least one predetermined phase region by locating in successive samples of the instantaneous power consumption at least one of a relative peak and a zero crossing.

10. The oil well arrangement according to claim 8, wherein said at least one predetermined phase region includes a downstroke of the pump, and the processor is operable to detect a reduction in power consumption during the downstroke characteristic of fall of a portion of the pump to a fluid level in a pump chamber of the pump.

11. The oil well arrangement according to claim 8, further comprising an electrical contactor coupling the motor to the power line, and wherein said means for measuring comprises a watt transducer of the electrical contactor.

12. The oil well arrangement according to claim 8, Wherein the processor is operable to integrate the power consumption during the downstroke of each successive cycle of the pump, and to compare a total power consumption during the downstroke to a predetermined minimum value, the processor including means to output a signal when the total power consumption during the downstroke fails to exceed the predetermined minimum value.

13. The oil well arrangement according to claim 12, wherein the predetermined minimum value is approximately half a nominal power consumption value characteristic of operation at the maximum capacity per pump stroke.

14. A method for monitoring a well having a cyclic well pump driven by an electric motor, comprising the steps of:

repetitively measuring an instantaneous electric power level applied to the motor to obtain successive samples;

identifying in the successive samples a periodic variation in power consumption occurring with an upstroke and a downstroke of the pump;

comparing the power consumption during successive downstrokes to determine a fillage level of the pump between successive downstrokes.

15. The method according to claim 14, wherein the downstroke is identified from a phase relationship with at least one of a zero crossing and a peak in the successive samples.

16. The method according to claim 15, wherein said comparing step includes comparing a power consumption for each downstroke to a nominal minimum contour of power consumption.

17. The method according to claim 16, further comprising determining a time during the downstroke at which the power consumption rises substantially to the nominal minimum contour, and relating said time to a position in the downstroke representing the pump encountering fluid in the pump.

* * * * *